United States Patent
Shim et al.

(10) Patent No.: US 10,198,987 B2
(45) Date of Patent: Feb. 5, 2019

(54) GATE DRIVING CIRCUIT

(71) Applicant: LG DISPLAY CO., LTD., Seoul (KR)

(72) Inventors: WooSung Shim, Hwaseong-si (KR); JunHo Bong, Gwangju (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/840,927

(22) Filed: Dec. 13, 2017

(65) Prior Publication Data
US 2018/0174503 A1   Jun. 21, 2018

(30) Foreign Application Priority Data
Dec. 19, 2016 (KR) .................... 10-2016-0173660

(51) Int. Cl.
*G09G 3/20* (2006.01)
*G11C 19/28* (2006.01)
(Continued)

(52) U.S. Cl.
CPC ......... *G09G 3/2092* (2013.01); *G11C 19/184* (2013.01); *G11C 19/28* (2013.01);
(Continued)

(58) Field of Classification Search
None
See application file for complete search history.

(56) References Cited

U.S. PATENT DOCUMENTS 5,410,583 A * 4/1995 Weisbrod ............... G11C 19/28
377/75

8,040,293 B2 * 10/2011 Jeong ................... G11C 19/184
345/100
(Continued)

FOREIGN PATENT DOCUMENTS

KR   2012 0072816 A   7/2012
KR   10-2015-0116102  10/2015

*Primary Examiner* — Cassandra Cox
(74) *Attorney, Agent, or Firm* — Seed Intellectual Property Law Group LLP

(57) ABSTRACT

The gate driving circuit includes a shift register including a plurality of stages. An n-th stage among the plurality of stages includes: a pull-up switching element outputting a first clock to an output node in accordance with a voltage in a Q node, a pull-down switching element outputting a gate low voltage VGL to the output node in accordance with a voltage in a QB node, and a logic unit inverting and outputting a voltage in the Q node and a voltage in the QB node. The logic unit includes a first switching element including a gate to which a fourth clock is input and being between a start voltage line which supplies a start voltage and the Q node, a second switching element including a gate connected to the Q node and being connected to the QB node, a third switching element being between the second switching element and a gate low voltage line which supplies the gate low voltage, a fourth switching element including a gate to which a third clock is input and being between a gate high voltage line which supplies a gate high voltage and the QB node, a fifth switching element including a gate connected to the QB node and being between the Q node and the gate low voltage line, a first capacitor between the Q node and the output node, and a second capacitor between the gate low voltage line and the gate of the pull-down switching element.

16 Claims, 11 Drawing Sheets

(51) Int. Cl.
  *G11C 19/18* (2006.01)
  *H03K 17/56* (2006.01)
(52) U.S. Cl.
  CPC .............. *G09G 2300/0408* (2013.01); *G09G 2300/0426* (2013.01); *G09G 2300/0871* (2013.01); *G09G 2300/0876* (2013.01); *G09G 2310/0281* (2013.01); *G09G 2310/0286* (2013.01); *G09G 2310/0289* (2013.01); *G09G 2310/08* (2013.01); *H03K 17/56* (2013.01)

(56) References Cited

U.S. PATENT DOCUMENTS

| | | | |
|---|---|---|---|
| 8,774,346 B2 * | 7/2014 | Son | G09G 3/20 |
| | | | 377/64 |
| 9,036,766 B2 * | 5/2015 | Umezaki | G11C 19/28 |
| | | | 377/64 |
| 9,165,676 B2 * | 10/2015 | Kang | G09G 3/3677 |
| 9,490,809 B2 * | 11/2016 | Lin | H03K 19/00384 |
| 9,495,929 B2 * | 11/2016 | Horiuchi | G11C 19/28 |
| 10,019,930 B2 * | 7/2018 | Tseng | G09G 3/2092 |
| 2006/0146978 A1 * | 7/2006 | Jang | G09G 3/3677 |
| | | | 377/64 |
| 2006/0238482 A1 * | 10/2006 | Jang | G09G 3/3677 |
| | | | 345/100 |
| 2007/0104307 A1 * | 5/2007 | Kim | G11C 19/28 |
| | | | 377/64 |
| 2015/0287376 A1 | 10/2015 | Lim et al. | |
| 2016/0224175 A1 * | 8/2016 | Moon | G06F 3/0412 |
| 2017/0032733 A1 * | 2/2017 | Jang | G09G 3/20 |
| 2018/0151125 A1 * | 5/2018 | Lee | G09G 3/3233 |

* cited by examiner

GATE DRIVING CIRCUIT

CROSS-REFERENCE TO RELATED APPLICATIONS

This application claims the priority of Korean Patent Application No. 10-2016-0173660 filed on Dec. 19, 2016, in the Korean Intellectual Property Office, the disclosure of which is incorporated herein by reference.

BACKGROUND

Field

The present disclosure relates to a gate driving circuit, and more particularly, to a gate driving circuit which is capable of implementing a narrow bezel.

Description of the Related Art

A flat panel display (FPD) is employed in various electronic devices such as a mobile phone, a tablet, a notebook computer, a television, and a monitor. A recent FPD includes a liquid crystal display device (hereinafter, referred to as "LCD"), an organic light emitting diode display (hereinafter, referred to as "OLED"), and the like. Such a display device includes a pixel array which includes a plurality of pixels to displays an image and a driving circuit which controls each of the plurality of pixels to transmit or emit light. The driving circuit of the display device includes a data driving circuit which supplies data signals to data lines of a pixel array, a gate driving circuit (or a scan driving circuit) which sequentially supplies gate signals (or scan signals) which are synchronized with the data signals to gate lines (or scan lines) of the pixel array, and a timing controller which controls the data driving circuit and the gate driving circuit, and the like.

Recently, as the display device is manufactured to be thinner, the gate driving circuit may be embedded in the display panel together with the pixel array. The gate driving circuit embedded in the display panel is known as a gate in panel (GIP) circuit. Therefore, in order to embed the gate driving circuit in the display panel, it is necessary to simplify a configuration of the gate driving circuit.

Specifically, the gate driving circuit is configured by a plurality of switching elements. Moreover, as the display device is developed to output high resolution, the gate driving circuit is configured by more switching elements to supply a gate signal to a plurality of gate lines. Accordingly, as the number of switching elements which configure the gate driving circuit is increased, the number of switching elements included in the gate driving circuit may cause a problem to embed the gate driving circuit in the display panel and implement a narrow bezel of the display device.

SUMMARY

An object of the present disclosure is to provide a gate driving circuit in which each of stages of a shift register is configured by six or seven switching elements, thereby significantly reducing the number of switching elements included in the gate driving circuit.

Another object of the present disclosure is to provide a gate driving circuit in which the number of switching elements configuring the gate driving circuit is reduced so that an area required to dispose the gate driving circuit in a display panel is reduced and a bezel size of the display panel is also reduced.

Objects of the present disclosure are not limited to the above-mentioned objects, and other objects, which are not mentioned above, can be clearly understood by those skilled in the art from the following descriptions.

According to an aspect of the present disclosure, there is provided a gate driving circuit. The gate driving circuit includes a shift register including a plurality of stages. An n-th stage (n is a positive integer) among the plurality of stages includes a pull-up switching element outputting a first clock to an output node in accordance with a voltage in a Q node, a pull-down switching element outputting a gate low voltage VGL to the output node in accordance with a voltage in a QB node, and a logic unit inverting and outputting a voltage in the Q node and a voltage in the QB node. The logic unit includes a first switching element including a gate to which a fourth clock is input and being between a start voltage line which supplies a start voltage and the Q node, a second switching element including a gate connected to the Q node and being connected to the QB node, a third switching element being between the second switching element and a gate low voltage line which supplies the gate low voltage, a fourth switching element including a gate to which a third clock is input and being between a gate high voltage line which supplies a gate high voltage and the QB node, a fifth switching element including a gate connected to the QB node and being between the Q node and the gate low voltage line, a first capacitor between the Q node and the output node, and a second capacitor between the gate low voltage line and the gate of the pull-down switching element. In the gate driving circuit according to an exemplary embodiment of the present disclosure, the number of switching elements and the number of clock signals for driving the gate driving circuit are reduced, so that a space required to dispose the gate driving circuit in the display panel is reduced and thus a bezel size of the display panel is also reduced.

According to another aspect of the present disclosure, there is provided a gate driving circuit. The gate driving circuit includes a shift register including a plurality of stages. An n-th stage (n is a positive integer) among the plurality of stages includes a pull-up switching element including a gate connected to a Q node and being between a first clock line which supplies a first clock and an output node, a pull-down switching element including a gate connected to a QB node and being between a gate low voltage line which supplies a gate low voltage and the output node, and a logic unit inverting and outputting a voltage in the Q node and a voltage in the QB node. The logic unit includes a first switching element including a gate to which a start voltage is input and being between a gate high voltage line which supplies a gate high voltage and the Q node, a second switching element including a gate connected to the Q node and is connected to the QB node, a fourth switching element including a gate to which a third clock is input and being between the gate high voltage line and the QB node, a fifth switching element including a gate connected to the QB node and being between the Q node and the gate low voltage line, a first capacitor between the Q node and the output node, and a second capacitor between the gate low voltage line and the gate of the pull-down switching element. In the gate driving circuit according to another exemplary embodiment of the present disclosure, the number of switching elements included in the gate driving circuit is significantly reduced so that the number of clock signals required to drive the gate driving circuit is reduced.

Other detailed matters of the exemplary embodiments are included in the detailed description and the drawings.

According to the present disclosure, it is possible to significantly reduce the number of switching elements included in the gate driving circuit and also reduce the number of clock signals required to drive one stage in the gate driving circuit.

According to the present disclosure, the number of switching elements and the number of clock signals for driving the gate driving circuit are reduced, so that a space required to dispose the gate driving circuit in the display panel is reduced and thus a bezel size of the display panel is also reduced.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
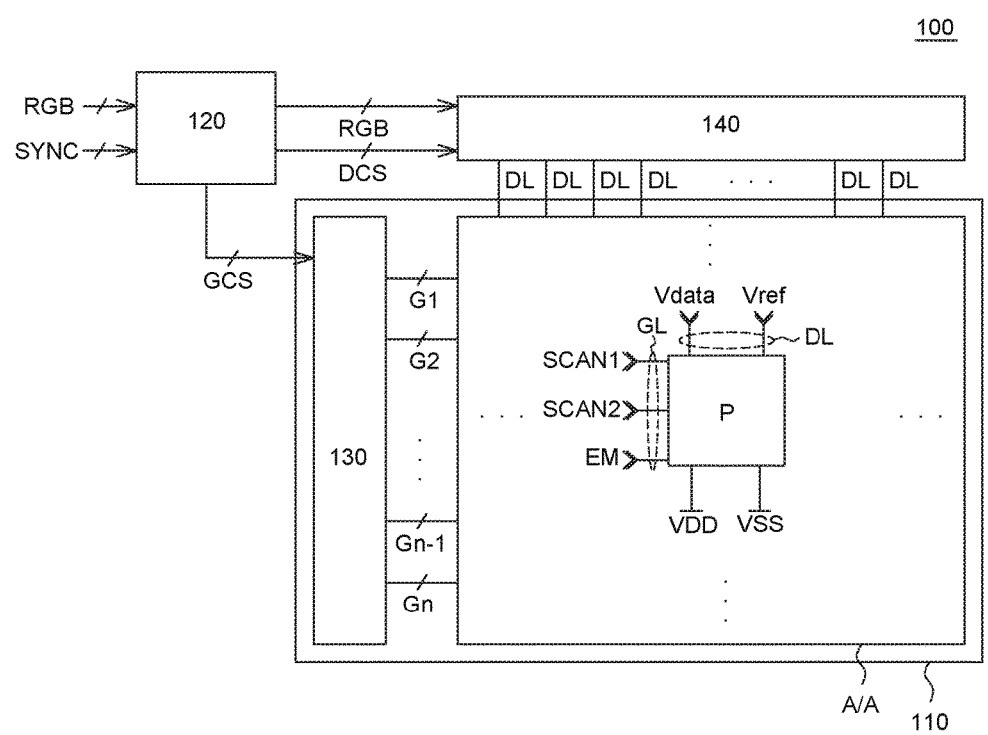
FIG. 1 is a schematic block diagram of a display device for explaining a gate driving circuit according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" other element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways as understood by those skilled in the art, and the embodiments can be carried out independently of or in association with each other.

In this disclosure, the TFT may be configured to be a P type or an N type. Further, when a pulse signal is described, a gate high voltage VGH state is defined as a "high state" and a gate low voltage VGL state is defined as a "low state."

Hereinafter, various exemplary embodiments of the present disclosure will be described in detail with reference to accompanying drawings.

FIG. 1 is a schematic block diagram of a display device for explaining a gate driving circuit according to an exemplary embodiment of the present disclosure.

Referring to FIG. 1, a display device 100 includes a display panel 110 including a plurality of pixels P, a gate driver 130 supplying a gate signal to each of the plurality of pixels P, a data driver 140 supplying a data signal to each of the plurality of pixels P, and a timing controller 120 controlling the gate driver 130 and the data driver 140.

The timing controller 120 processes image data RGB input from the outside in accordance with a size and a resolution of the display panel 110 to supply the image data to the data driver 140. The timing controller 120 generates a gate control signal GCS and a data control signal DCS using synchronizing signals input from the outside, for example, a dot clock signal, a horizontal synchronizing signal, and a vertical synchronizing signal. The timing controller supplies the generated gate control signal GCS and the generated data control signal DCS to the gate driver 130 and the data driver 140, respectively, to control the gate driver 130 and the data driver 140.

The gate driver 130 supplies a gate signal to the gate line GL in accordance with the gate control signal GCS supplied from the timing controller 120. Here, the gate signal includes at least one scan signal. Even though it is illustrated in FIG. 1 that the gate driver 130 is disposed on one side in the display panel 110, the number of gate drivers 130 and an arrangement position are not limited thereto. That is, the gate driver 130 may be disposed on one side or both sides of the display panel 110 in a gate in panel (GIP) manner.

Referring to FIG. 1, the gate driver 130 is disposed on one side of an active area A/A in the display panel 110 and is connected to the active area A/A through gate lines G1 to Gn. The gate driver 130 includes a plurality of stages. The plurality of stages outputs gate signals and supplies the gate signals to the active area A/A through the gate lines G1 to Gn. A specific configuration of the gate driver 130 will be described below with reference to FIG. 2.

Further, the gate driver 130 includes a shift register configured by a plurality of stages. Each of the plurality of stages in the shift register may include a plurality of switching elements. For example, one stage includes six or seven switching elements and correspondingly, three clock signals, a start voltage, and a gate voltage may be supplied to drive the shift register. A specific configuration of the stage in the shift register will be described below with reference to FIG. 3.

The data driver 140 converts the image data RGB into a data voltage in accordance with the data control signal DCS supplied from the timing controller 120 and supplies the converted data voltage to the pixel P through the data line DL.

In the display panel 110, the plurality of gate lines GL and the plurality of data lines DL intersect each other and each of the plurality of pixels P is connected to the gate line GL and the data line DL. Specifically, one pixel P is supplied with a gate signal from the gate driver 130 through the gate line GL and is supplied with a data signal from the data driver 140 through the data line DL. Therefore, one pixel P receives an emission control signal EM and scan signals SCAN1 and SCAN2 through the gate lines GL and receives a data voltage Vdata and a reference voltage Vref through the data lines DL.

The display device 100 according to an exemplary embodiment of the present disclosure includes the gate driver 130 and the data driver 140 which drive the display panel 110 including the plurality of pixels P and the timing controller 120 which controls the gate driver 130 and the data driver 140. Here, the gate driver 130 includes the shift register including the plurality of stages. Each of the plurality of stages of the shift register may include six or seven switching elements and two capacitors. By doing this, in the gate driving circuit 130, the number of switching elements required to configure the shift register may be significantly reduced and a space required to dispose the gate driving circuit 130 in the display device 100 may be significantly reduced.

Figure 2:
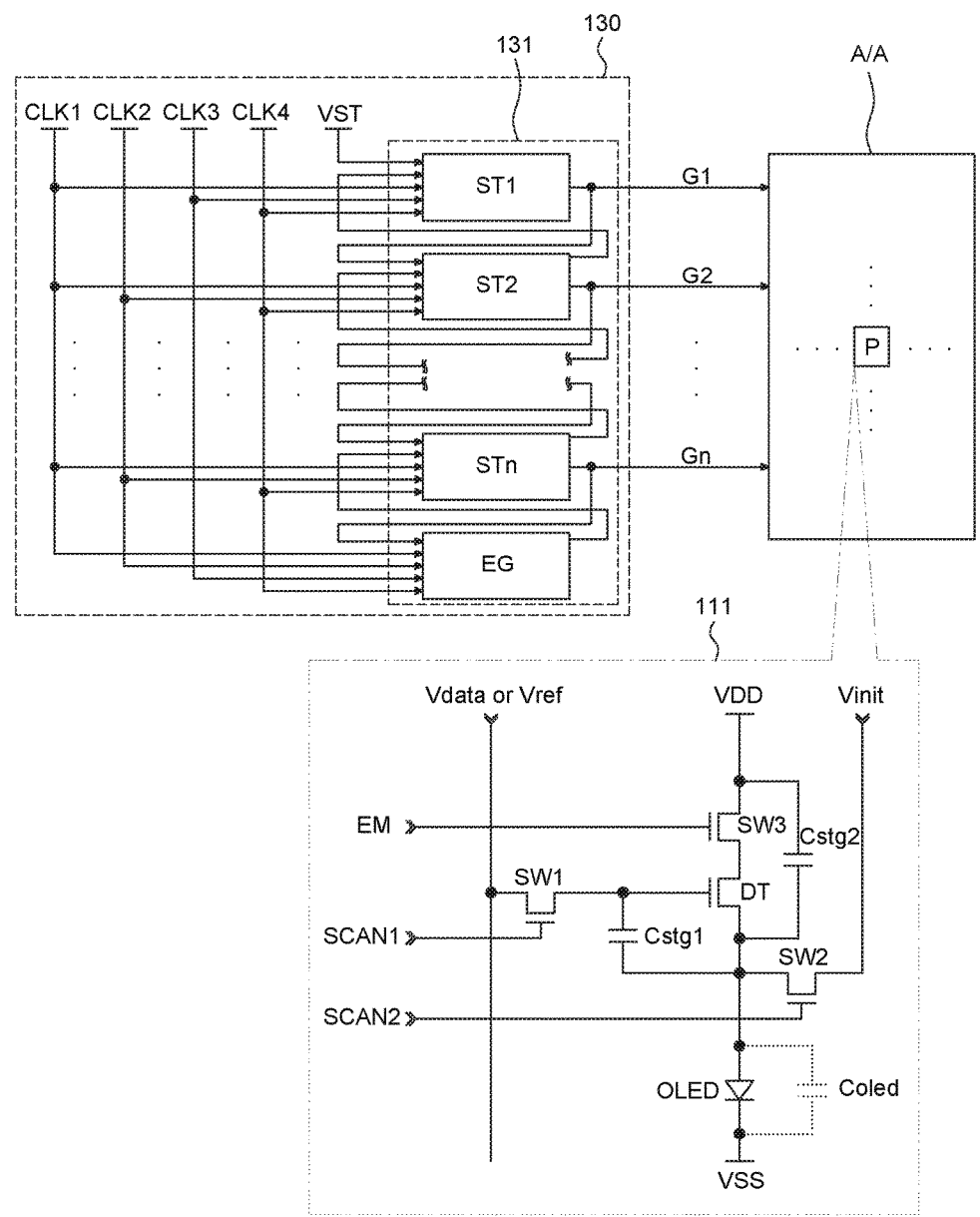
FIG. 2 is a schematic block diagram illustrating a configuration of a gate driving circuit according to an exemplary embodiment of the present disclosure.

FIG. 2 is a schematic block diagram illustrating a configuration of a gate driving circuit according to an exemplary embodiment of the present disclosure. For the convenience of description, this will be described with reference to FIG. 1.

Referring to FIG. 2, the gate driving circuit 130 is disposed in one side of the active area A/A. Even though it is illustrated in FIG. 2 that the gate driving circuit 130 is disposed only on one side of the active area A/A, the gate driving circuit may be disposed on both sides of the active area A/A in some exemplary embodiments. The gate driving circuit 130 includes a shift register 131 including a plurality of stages ST1 to STn. Specifically, the shift register 131 includes a plurality of stages ST1 to STn which is dependently connected to each other. A specific configuration of one stage of the plurality of stages ST1 to STn in the shift register 131 will be described below with reference to FIG. 3.

Referring to FIG. 2, there may be a dummy stage EG which does not generate an output and supplies a carry signal to other stages in the shift register 131. That is, the shift register 131 may include a dummy stage EG as a next stage of a last stage STn. That is, the dummy stage EG is connected to the last stage which outputs a last gate signal. The dummy stage EG does not output a gate signal but supplies a carry signal to the last stage STn.

The shift register 131 in the gate driving circuit 130 sequentially supplies the gate signals to the active area A/A through the gate lines G1 to Gn. Specifically, the shift register 131 receives a gate driver control signal GDC to generate a gate signal. Here, the gate driver control signal GDC includes a gate start pulse (GSP), gate shift clocks (GSC) CLK1, CLK2, CLK3, and CLK4, and the like. That is, a first clock CLK1, a second clock CLK2, a third clock CLK3, a fourth clock CLK4, a carry signal or a start voltage VST received from the previous stage, and a gate high voltage VGH or a gate low voltage VGL are input to the shift register 131. The plurality of gate shift clocks CLK1, CLK2, CLK3, and CLK4 includes the first clock CLK1, the second clock CLK2, the third clock CLK3, and the fourth clock CLK4. Here, the gate start pulse GSP may be used as the same meaning as the start voltage VST and a specific start voltage VST and input/output signals in the stage will be described below with reference to FIG. 4.

Therefore, the shift register 131 sequentially supplies the gate signals generated in the plurality of stages ST1 to STn to the gate lines G1 to Gn by the gate driver control signal GDC. Specifically, the stages ST1 to STn of the shift register 131 start generating gate signals in response to the start voltage VST and the switching elements included in the stages ST1 to STn operate in every period divided by the first clock CLK1 to fourth clock CLK4 so that the gate signal is shifted to be output.

Specifically, three types of clocks among the first clock CLK1 to fourth clock CLK4 may be supplied to each of the plurality of stages ST1 to STn. For example, the first clock CLK1, the third clock CLK3, and the fourth clock CLK4 are supplied to the first stage ST1 and the first clock CLK1, the second clock CLK2, and the fourth clock CLK4 are supplied to the second stage ST2. That is, four types of clocks are supplied to the entire of the plurality of stages ST1 to STn and only three types of clocks are supplied to each of the stages to output a gate signal.

The gate signal output from each of the stages ST1 to STn is supplied to the gate lines G1 to Gn and also input to the next stage as a carry signal, simultaneously. A specific operation of the switching elements included in the stages ST1 to STn in every period divided by the first clock CLK1 to fourth clock CLK4 will be described below with reference to FIGS. 4 to 5D.

Referring to FIG. 2, each of the plurality of pixels P includes a pixel driving circuit 111. The pixel driving circuit 111 includes a first pixel driving switching element SW1, a second pixel driving switching element SW2, a third pixel driving switching element SW3, a driving switching element DT, a first storage capacitor Cstg1, and a second storage capacitor Cstg2. A first scan signal SCAN1 is supplied to the first pixel driving switching element SW1, a second scan signal SCAN2 is supplied to the second pixel driving switching element SW2, and an emission control signal EM is supplied to the third pixel driving switching element SW3. Here, the gate signal generated in each of the plurality of stages ST1 to STn may include the first scan signal SCAN1, the second scan signal SCAN2, and the emission control signal EM.

The gate driving circuit according to the exemplary embodiment of the present disclosure is configured by the shift register 131 including the plurality of stages ST1 to STn. Various gate driver control signals GDC are input to each of the plurality of stages ST1 to STn to shift the gate signals. Each of the plurality of stages ST1 to STn supplies the shifted gate signals to the gate lines G1 to Gn. Therefore, each of the plurality of stages ST1 to STn includes a less number of switching elements and shifts the gate signals by three types of clocks and the start voltage VST to output the shifted gate signals. Therefore, the gate driving circuit 130 may reduce the number of clocks and gate driver control signals GDC required to drive the shift register 131. Therefore, the number of wiring lines for supplying the clocks and gate driver control signals GDC may also be reduced. Moreover, as the number of wiring lines connected to the gate driver 130 is reduced, an area required to dispose the gate driving circuit 130 in the display device 100 is also reduced. A specific circuit configuration of each of the plurality of stages ST1 to STn will be described below with reference to FIG. 3.

Figure 3:
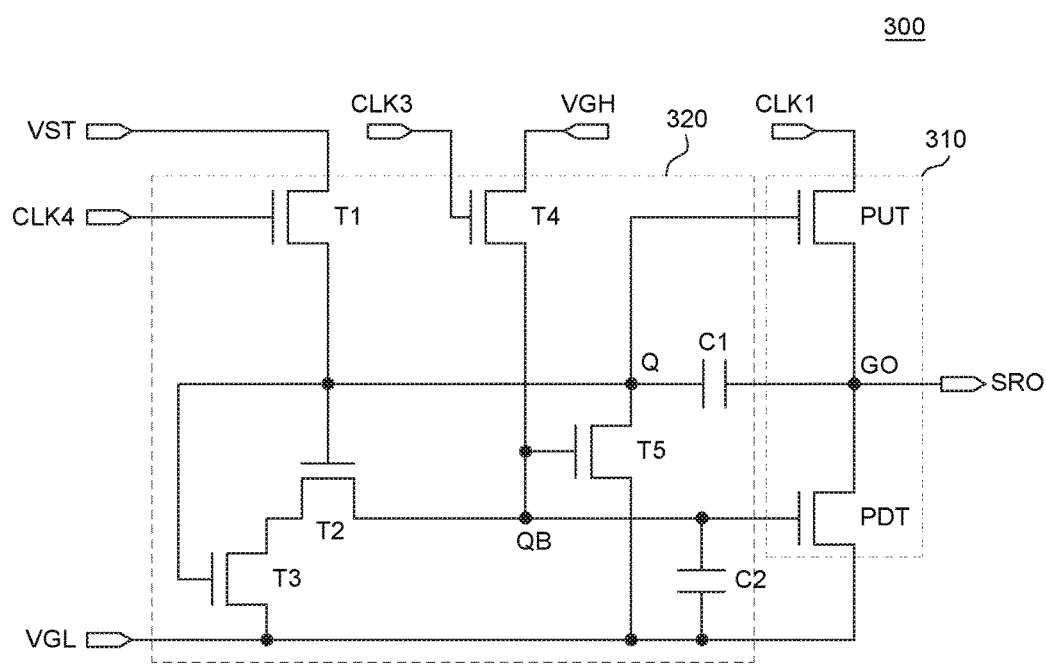
FIG. 3 is a circuit diagram illustrating a configuration of one of a plurality of stages in a shift register according to an exemplary embodiment of the present disclosure.

FIG. 3 is a circuit diagram illustrating a configuration of one of a plurality of stages in a shift register according to an exemplary embodiment of the present disclosure. For the convenience of description, this will be described with reference to FIGS. 1 and 2.

Referring to FIG. 3, the stage 300 includes a pull-up switching element PUT, a pull-down switching element PDT, a first switching element T1, a second switching element T2, a third switching element T3, a fourth switching element T4, a fifth switching element T5, a first capacitor C1, and a second capacitor C2. That is, the stage 300 includes seven switching elements and two capacitors. Here, a configuration including the pull-up switching element PUT and the pull-down switching element PDT may be referred to as a buffer unit 310. A logic unit 320 includes the first switching element T1, the second switching element T2, the third switching element T3, the fourth switching element T4, the fifth switching element T5, the first capacitor C1, and the second capacitor C2. That is, the stage 300 includes the buffer unit 310 and the logic unit 320. The logic unit 320 may invert a voltage in a Q node Q and a voltage in a QB node to output the inverted voltages. Here, a TFT is an example of a switching element and the switching element may be used by another type of element in some exemplary embodiment.

Referring to FIG. 3, the pull-up switching element PUT includes a gate connected to the Q node Q and is disposed between a first clock line which supplies the first clock CLK1 and the output node GO. Specifically, the Q node Q is connected to a gate of the pull-up switching element PUT and the first clock line which supplies the first clock CLK1 is connected to a drain of the pull-up switching element PUT, and the output node GO is connected to a source of the pull-up switching element PUT.

In the meantime, an n-th stage STn includes a pull-up switching element PUT which outputs the first clock CLK1 to the output node GO in accordance with a voltage in the Q node Q. An n–1-th stage STn-1 which is a previous stage of the n-th stage STn includes a pull-up switching element PUT which outputs the second clock CLK2 to the output node GO in accordance with the voltage in the Q node Q. That is, four types of clocks are supplied to the entire of the plurality of stages ST1 to STn and only three types of clocks are supplied to each of the stages to output a gate signal.

Referring to FIG. 3, the pull-down switching element PDT includes a gate connected to the QB node QB and is disposed between a gate low voltage line which supplies the gate low voltage VGL and the output node GO. Specifically, the QB node QB is connected to a gate of the pull-down switching element PDT and the gate low voltage line which supplies the gate low voltage VGL is connected to a drain of the pull-down switching element PDT, and the output node GO is connected to a source of the pull-down switching element PDT.

Referring to FIG. 3, the first switching element T1 includes a gate to which the fourth clock CLK4 is input and is disposed between a start voltage line which supplies the start voltage VST and the Q node Q.

Referring to FIG. 3, the second switching element T2 includes a gate connected to the Q node Q and is connected to the QB node QB. Further, the second switching element T2 is disposed between the third switching element T3 and the QB node QB. Further, the third switching element T3 includes a gate connected to the Q node Q and is disposed between the second switching element T2 and the gate low voltage line.

Referring to FIG. 3, the fourth switching element T4 includes a gate to which the third clock CLK3 is input and is disposed between a gate high voltage line which supplies the gate high voltage VGH and the QB node QB. Further, the fifth switching element T5 includes a gate connected to the QB node QB and is disposed between the Q node Q and the gate low voltage line.

Referring to FIG. 3, the first capacitor C1 is disposed between the Q node Q and the output node GO. That is, the first capacitor C1 is disposed between the gate and the source of the pull-up switching element PUT. Therefore, the first capacitor C1 may bootstrap the gate and the source of the pull-up switching element PUT in accordance with the voltage in the Q node and a waveform of the first clock CLK1. The second capacitor C2 is disposed between the gate low voltage line which supplies the gate low voltage VGL and the gate of the pull-down switching element PDT.

The first clock CLK1, the second clock CLK2, the third clock CLK3, the fourth clock CLK4, the start voltage VST, the gate high voltage VGH, and the gate low voltage VGL are supplied to the stage 300. In this case, when the first clock CLK1, the second clock CLK2, the third clock CLK3, the fourth clock CLK4, and the start voltage VST are high, these are gate high voltages VGH, respectively. When the first clock CLK1, the second clock CLK2, the third clock CLK3, the fourth clock CLK4, and the start voltage VST are low, these are gate low voltages VGL.

Therefore, the pull-up switching element PUT outputs the first clock CLK1 to the output node GO in accordance with the voltage in the Q node Q. The pull-down switching element PDT outputs the gate low voltage VGL to the output node GO in accordance with the voltage in the QB node QB. That is, the output node GO may output one of the first clock CLK1 and the gate low voltage VGL by the pull-up switching element PUT and the pull-down switching element PDT in accordance with a timing at which the first clock CLK1, the third clock CLK3, the fourth clock CLK4, and the start voltage VST are supplied to the stage 300. Specific waveforms output by input signals, for example, the first clock CLK1, the second clock CLK2, the third clock CLK3, the fourth clock CLK4, and the start voltage VST, in the stage 100 of the shift register, will be described below with reference to FIG. 4.

Figure 4:
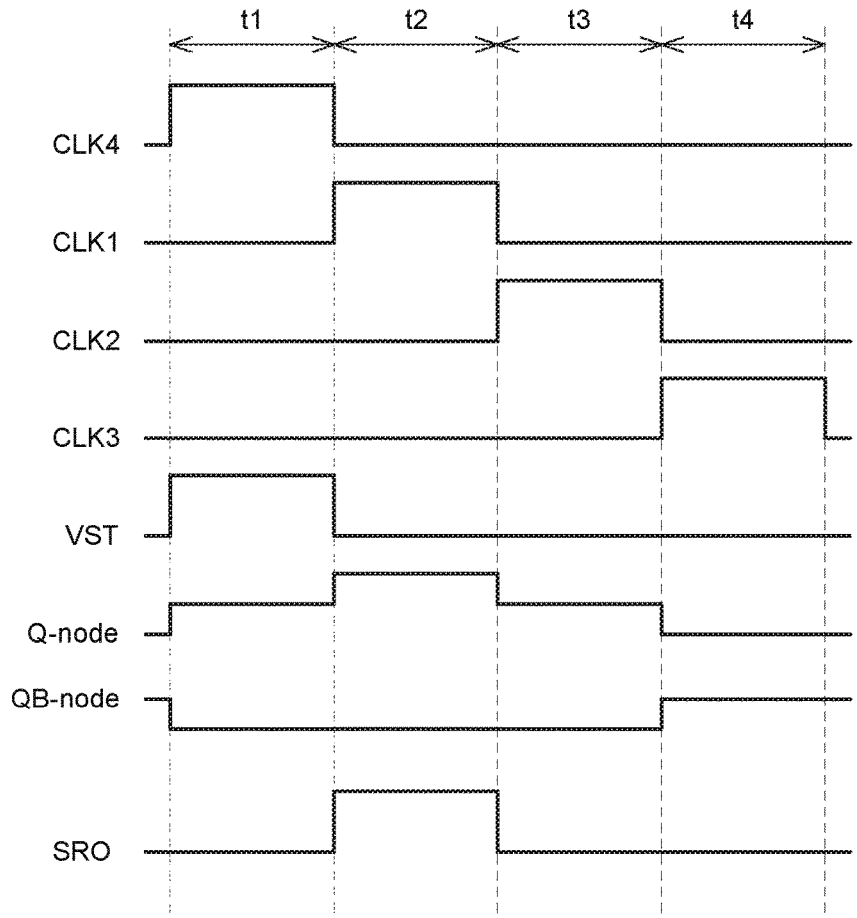
FIG. 4 is a waveform illustrating an input/output signal in a stage of the shift register according to an exemplary embodiment of the present disclosure illustrated in FIG. 3.

FIG. 4 is a waveform diagram illustrating an input/output signal in a stage of the shift register according to an exemplary embodiment of the present disclosure illustrated in FIG. 3. FIGS. 5A to 5D are circuit diagrams illustrating a flow of a signal in a stage of a shift register according to an exemplary embodiment of the present disclosure according to a waveform illustrated in FIG. 4. The circuit diagrams illustrated in FIGS. 5A to 5D are circuit diagrams illustrated to explain a flow of a signal during periods divided by the input signal and have the substantially same configuration as the circuit diagram illustrated in FIG. 3. A redundant description for the configuration of the stage 300 will be omitted. A one-dot chain line illustrated in FIGS. 5A to 5D indicates a flow of an internal signal by a signal input to the stage 300 and a dotted line indicates a portion which is not activated by the signal input to the stage 300. For the convenience of description, this will be described with reference to FIGS. 1 and 2.

Referring to FIG. 4, a first period t1, a second period t2, a third period t3, and a fourth period t4 are divided in accordance with pulse timings of the first clock CLK1, the second clock CLK2, and the start voltage VST supplied to the stage 300 of the present disclosure.

During the first period t1, the start voltage VST and the fourth clock CLK4 are input to the stage 300 as gate high voltages VGH and the first clock CLK1 and the third clock CLK3 are input as gate low voltages VGL.

During the second period t2, only the first clock CLK1 is input as a gate high voltage VGH and the third clock CLK3, the fourth clock CLK4, and the start voltage VST are input as gate low voltages VGL.

During the third period t3, only the second clock CLK2 is input to the shift register 131 as a gate high voltage VGH and the first clock CLK1, the third clock CLK3, the fourth clock CLK4, and the start voltage VST are input to the stage 300 as gate low voltages VGL.

During the fourth period t4, only the third clock CLK3 is input as a gate high voltage VGH and the first clock CLK1, the fourth clock CLK4, and the start voltage VST are input as gate low voltages VGL.

Here, the first clock CLK1 to fourth clock CLK4 are supplied to the shift register 131 with a phase difference so as not to overlap each other during the first period t1 to fourth period t4. As described above, a method of driving the shift register 131 using four clocks is called a four-phase driving method.

Figure 5A:
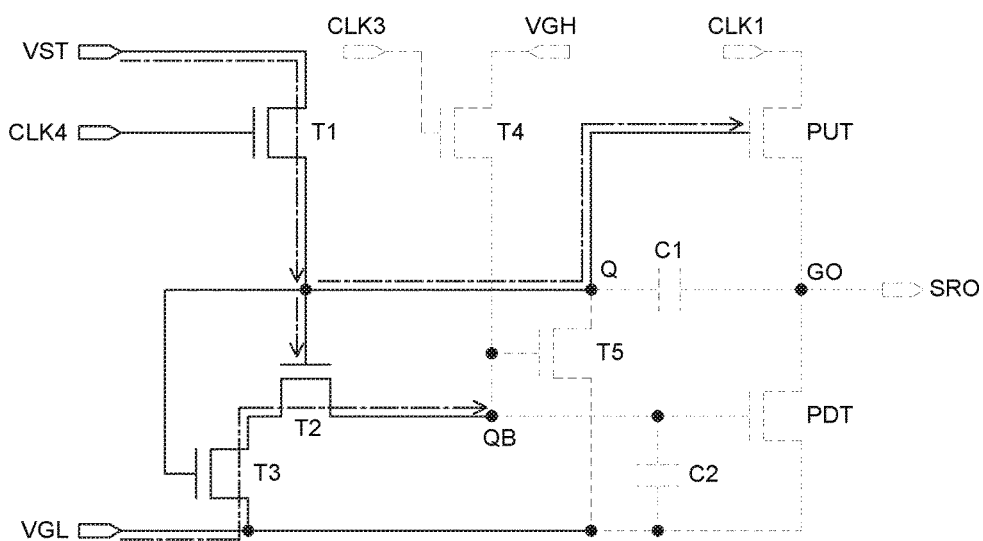
FIGS. 5A to 5D are circuit diagrams illustrating a flow of a signal in a stage of a shift register according to an exemplary embodiment of the present disclosure according to a waveform illustrated in FIG. 4.

Referring to FIGS. 4 and 5A, as the start voltage VST and the fourth clock CLK4 are input to the stage 300 as gate high voltages VGH during the first period t1, all the first switching element t1, the second switching element t2, and the third switching element t3 are turned on. That is, as the first switching element t1 is turned on by the gate high voltage VGH of the fourth clock CLK4, the start voltage VST in a high state is supplied to the Q node Q. As described above, when both the start voltage VST and the fourth clock CLK4 supplied from the start voltage line are high, the first switching element T1 may charge the Q node Q to be high.

Since both the gate of the second switching element T1 and the gate of the third switching element T3 are connected to the Q node Q, when the voltage in the Q node Q is high, both the second switching element T2 and the third switching element T3 are turned on. The third switching element T3 is connected to the gate low voltage line which supplies the gate low voltage VGL and the second switching element T2 is disposed between the third switching element T3 and the QB node QB to be electrically connected. Therefore, when the voltage in the Q node Q is a high state, the second switching element T2 and the third switching element T3 may supply the gate low voltage VGL to the QB node QB.

Therefore, the start voltage VST in a high state is input to the Q node Q through the turned-on first switching element T1 and the voltage in the Q node rises by the start voltage VST. Further, the gate low voltage VGL is input to the QB node QB through the turned-on second switching element T2 and third switching element T3 so that the voltage in the QB node drops to the gate low voltage VGL.

Figure 5B:
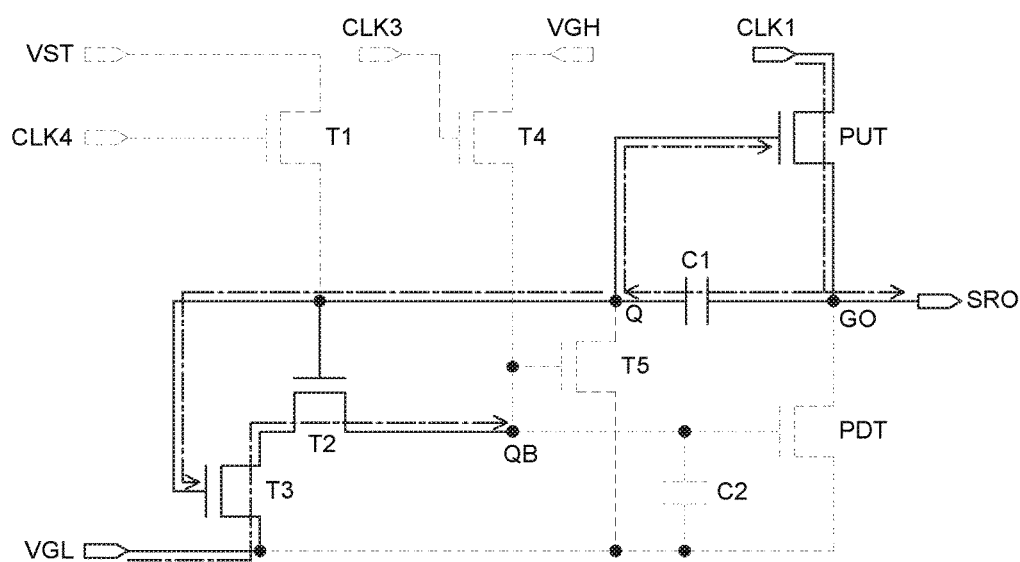

Next, referring to FIGS. 4 and 5B, as the first clock CLK1 is input to the stage 300 as a gate high voltage VGH during the second period t2, the first clock CLK1 is output to the output node Go through the pull-up switching element PUT. Specifically, since the voltage in the Q node Q is high during the second period t2, a voltage in the gate of the pull-up switching element PUT is also high. Therefore, the pull-up switching element PUT is turned on and the first clock CLK1 is supplied from the drain of the pull-up switching element PUT. The first clock CLK1 in a high state is supplied to the output node GO through the turned-on pull-up switching element PUT.

Therefore, the first clock CLK1 converts a shift register output SRO which is an output of the shift register 131 to a high state through the output node GO to be supplied to the gate line as a gate signal. Further, as the first clock CLK1 raises the voltage in the output node GO, the voltage in the Q node Q may rise. Here, the first capacitor C1 electrically connects between the floated Q node Q and the output node GO. Specifically, when the voltage in the Q node is high and the first clock CLK1 in a high state is input, the first capacitor C1 may raise the voltage in the Q node Q in accordance with the rising of the voltage in the output node GO. That is, when the voltage in the output node GO rises through the coupling of the capacitor, the first capacitor C1 raises the voltage in the Q node Q which is electrically connected thereto. As described above, a phenomenon that when a voltage of one of both nodes of the first capacitor C rises, a voltage of the other node also rises due to the capacitor coupling is called bootstrapping. That is, the first capacitor C1 is a capacitor for bootstrapping.

Therefore, the voltage in the gate of the pull-up switching element PUT and the voltage in the source are bootstrapped, so that a voltage Vgs between the gate and the source of the pull-up switching element PUT may be constantly maintained. As described above, Vgs of the pull-up switching element PUT is constantly maintained due to the bootstrapping by the first capacitor C1 during the second period t2, so that the pull-up switching element PUT is not turned off, but is maintained to be turned on.

As described above, the pull-up switching element PUT is maintained to be turned on during the second period t2 so that the first clock CLK1 supplied from the drain of the pull-up switching element PUT during the second period t2 may be output through the output node GO of the stage 300 as it is. That is, the first clock CLK1 may be output to the gate line connected to the stage 300 as a gate signal during the second period t2.

Figure 5C:
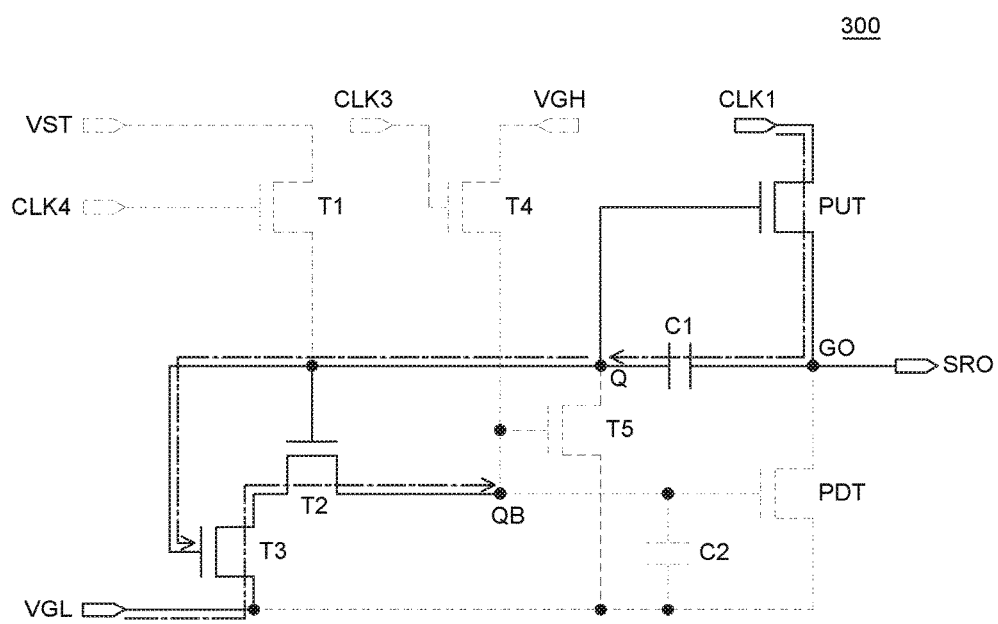

Next, referring to FIGS. 4 and 5C, as the first clock CLK1, the third clock CLK3, the fourth clock CLK4, and the start voltage VST are input to the stage 300 as gate low voltages VGL during the third period t3, both the first switching element T1 and the fourth switching element T4 are turned off. In the meantime, the voltage in the Q node Q is high, so that the pull-switching element PUT is turned on.

Therefore, the first clock CLK1 in a low state is input through the turned-on pull-up switching element PUT so that the shift register output SR0 in the output node GO is converted into a low state. Moreover, as the voltage in the output node GO is changed to a low state, the voltage in the Q node Q also drops due to the bootstrapping of the first capacitor.

However, even though the voltage in the Q node drops due to the bootstrapping of the first capacitor C1, the voltage in the Q node A is still high. Therefore, the second switching element T2 and the third switching element T3 are still turned-on. Therefore, the second switching element T2 and the third switching element T3 may maintain the voltage in the QB node QB to be low.

As described above, the gate low voltage VGL is supplied to the output node GO through the pull-up switching element PUT during the third period t3 so that the shift register output SRO is changed to a low state. Therefore, after the first clock CLK1 is output as a gate signal during the second period t2, the voltage in the output node GO is changed to a gate low voltage VGL again, so that the stage 300 may be controlled to output the gate signal during a specific period and not to output the gate signal during the remaining period.

Figure 5D:
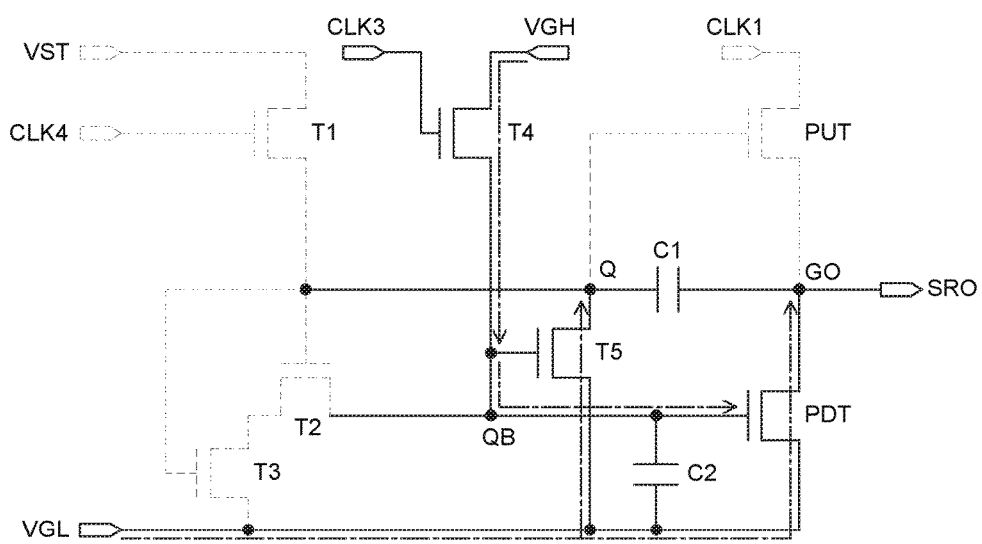

Next, referring to FIGS. 4 and 5D, as only the third clock CLK3 is input to the stage 300 as a gate high voltage VGH during the fourth period t4, the fourth switching element T4 is turned on. Therefore, as the fourth switching element T4 is turned on, the gate high voltage VGH is supplied to the QB node QB through the gate high voltage line connected to the fourth switching element T4.

As the voltage in the QB node QB rises to be high, the fifth switching element T5 is turned on. The turned-on fifth switching element T5 electrically connects between the Q node Q and the gate low voltage line to supply the gate low voltage VGL to the Q node Q. Therefore, the voltage in the Q node Q drops to a low state.

Moreover, when the voltage in the QB node QB is high, the pull-down switching element PDT is also turned on. The turned-on pull-down switching element PDT electrically connects between the output node GO and the gate low voltage line to supply the gate low voltage VGL to the output node GO. Therefore, the voltage in the output node GO drops to a low state.

In the meantime, even when the third clock CLK3 is in a low state after the fourth period t4, the second capacitor C2 may maintain the voltage in the QB node QB to be a high state in the stage 300. Specifically, when the fourth clock CLK4 is input in a high state and the start voltage VST and the third clock CLK3 are input in a low state after the fourth period t4, the first switching element T1 is turned on and the fourth switching element T4 is turned off. Here, the second capacitor C2 maintains the voltage in the QB node QB through the charged voltage so that the voltage dropping in the QB node QB may be suppressed.

The stage 300 according to an exemplary embodiment of the present disclosure includes seven switching elements and two capacitors so that the number of switching elements required to sequentially output the gate signals may be significantly reduced. Moreover, since the stage 300 includes seven switching elements, three types of clocks CLK1, CLK3, and CLK4 are supplied to one stage to drive seven switching elements corresponding to the first period t1 to fourth period t4. That is, the number of switching elements may be reduced while maintaining four types of clock signal required to drive the gate driving circuit 130 including the stage 300.

Therefore, as the number of switching elements which configure the stage 300 and the gate driving circuit 130 is reduced, the space required to dispose the gate driving circuit 130 in the display device 100 may be significantly reduced.

Figure 6:
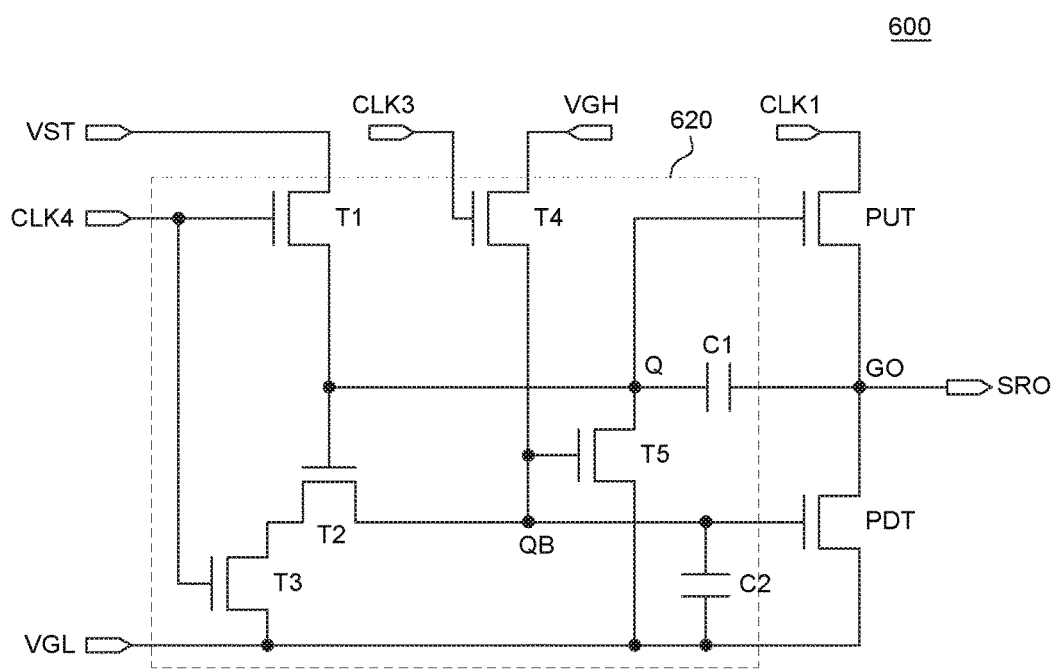
FIG. 6 is a circuit diagram illustrating a configuration of one of a plurality of stages in a shift register according to another exemplary embodiment of the present disclosure.

FIG. 6 is a circuit diagram illustrating a configuration of one of a plurality of stages in a shift register according to another exemplary embodiment of the present disclosure. FIG. 6 is a circuit diagram in which only a line connection relationship of the logic unit 620 is partially changed from the circuit diagram illustrated in FIG. 3 and other configuration is substantially same as the circuit diagram illustrated in FIG. 3. Therefore, a redundant description of the stage configuration and the flow of the signal according to an input/output signal will be omitted. For the convenience of description, this will be described with reference to FIGS. 1, 2 and 4.

Referring to FIG. 6, in a stage 600, a logic unit 620 includes a first switching element T1, a second switching element T2, a third switching element T3, a fourth switching element T4, a fifth switching element T5, a first capacitor C1, and a second capacitor C2. The logic unit 620 is connected to a pull-up switching element PUT through a Q node Q and is connected to a pull-down switching element PDT through a QB node QB.

Referring to FIG. 6, the third switching element T3 includes a gate to which the fourth clock CLK4 is input and is disposed between the second switching element T2 and the gate low voltage line. That is, both the first switching element T1 and the third switching element T3 include the gates to which the fourth clock CLK4 is input. When the fourth clock CLK4 is high, both the first switching element T1 and the third switching element T3 are turned on.

Therefore, as the fourth clock CLK4 is input to the stage 600 as a gate high voltage VGH during the first period t1, both the first switching element T1 and the third switching element T3 are turned on. That is, as the first switching element t1 is turned on by the gate high voltage VGH of the fourth clock CLK4, the start voltage VST in a high state is supplied to the Q node Q. By doing this, the second switching element T2 is turned on. Further, as the third switching element T3 is turned on by the gate high voltage VGH of the fourth clock CLK4, the gate low voltage VGL is supplied to the QB node QB through the turned-on second switching element T2.

The stage 600 of the shift register according to another exemplary embodiment of the present disclosure is configured to connect a clock line which supplies the fourth clock CLK4 to the first switching element T1 and the third switching element T3, respectively. Therefore, the first switching element T1 and the third switching element T3 share the clock line which supplies the fourth clock CLK4, so that it is advantageous to design a layout in the gate driving circuit including the shift register.

Figure 7:
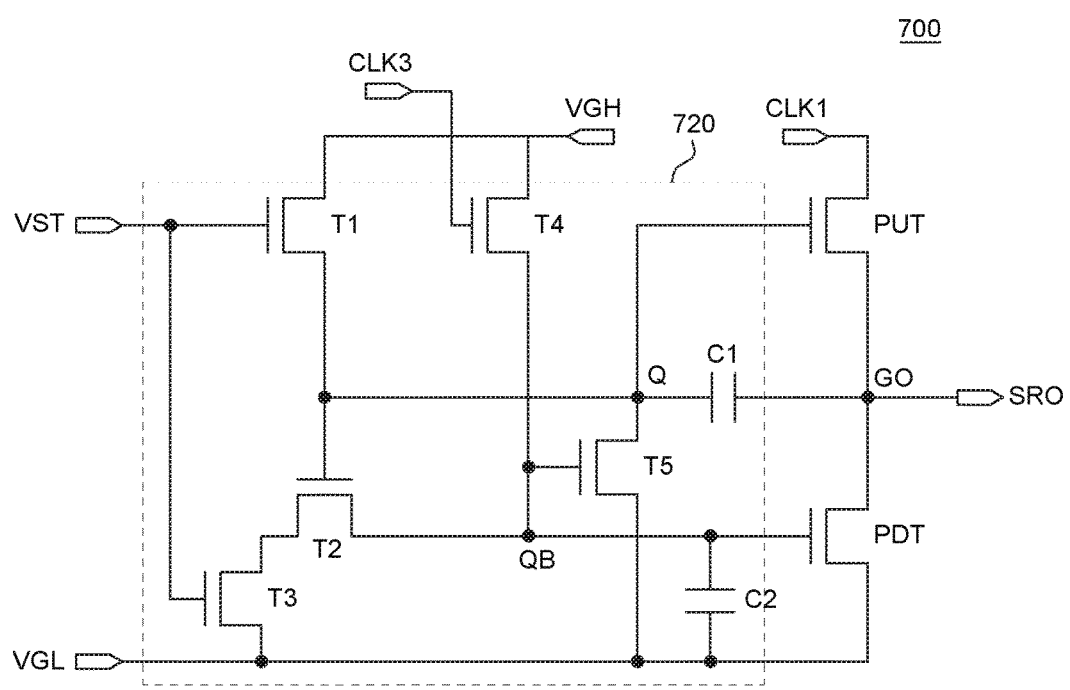
FIG. 7 is a circuit diagram illustrating a configuration of one of a plurality of stages in a shift register according to still another exemplary embodiment of the present disclosure.

FIG. 7 is a circuit diagram illustrating a configuration of one of a plurality of stages in a shift register according to still another exemplary embodiment of the present disclosure. FIG. 7 is a circuit diagram in which only a wiring connection relationship of the logic unit 720 is partially changed from the circuit diagram illustrated in FIG. 6 and other configuration is substantially same as the circuit diagram illustrated in FIG. 6. Therefore, a redundant description of the configuration of the stage 700 and the flow of the signal according to an input/output signal will be omitted. For the convenience of description, this will be described with reference to FIGS. 1, 2 and 4.

Referring to FIG. 7, the logic unit 720 of the stage 700 includes a gate connected to a start voltage line which supplies a start voltage VST and a first switching element T1 disposed between a gate high voltage line which supplies a gate high voltage VGH and a Q node Q. Further, the logic unit 720 includes a gate to which the start voltage VST is input and includes a third switching element T3 disposed between the second switching element T2 and the gate low voltage line.

Therefore, the fourth clock CLK4 may not be supplied to the stage 700 during the first period t1. Specifically, both the first switching element T1 and the third switching element T3 include a gate which is connected to the start voltage line and the first switching element T1 is disposed between the gate high voltage line and the Q node Q, so that a separate fourth clock CLK4 is not necessary. That is, instead of the fourth clock CLK4, the start voltage VST is input to the gate of the first switching element T1 and the gate of the third switching element T3 during the first period t1, so that both the first switching element T1 and the third switching element T3 are turned on. As the first switching element T1 is turned on during the first period t1, the gate high voltage VGH is supplied to the Q node Q. By doing this, the second switching element T2 is turned on. Further, as the third switching element T3 is turned on by the high state of the start voltage VST during the first period t1, the gate low voltage VGL is supplied to the QB node QB through the turned-on second switching element T2.

The stage 700 of the shift register according to another exemplary embodiment of the present disclosure includes the first switching element T1 and the third switching element T3 including gates to which the start voltage VST is supplied. Specifically, the first switching element T1 is disposed between the gate high voltage line and the Q node Q, so that a separate clock line which supplies the fourth clock CLK4 is not connected to the first switching element T1. Therefore, the clock line which supplies the fourth clock CLK4 to the first switching element T1 and the third switching element T3 may be removed. Moreover, the clock line is removed from the gate driving circuit including the stage 700 according to another exemplary embodiment of the present disclosure. Therefore, the number of clock signals required to drive the gate driving circuit is reduced and a wiring space which is disposed on one side of the display panel is reduced, so that a bezel size may be reduced.

Figure 8:
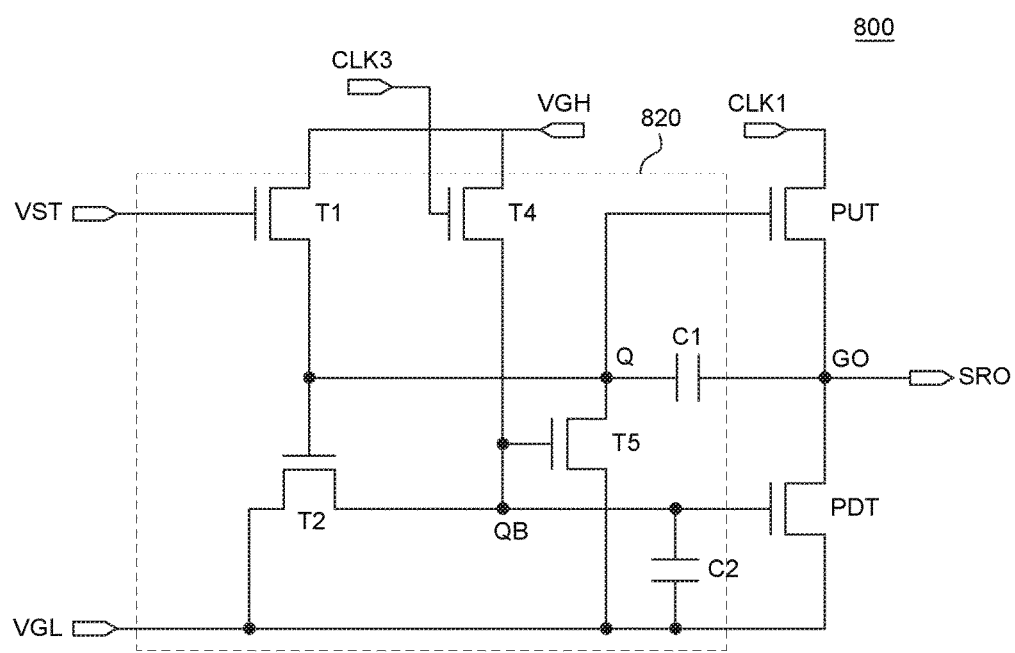
FIG. 8 is a circuit diagram illustrating a configuration of one of a plurality of stages in a shift register according to still another exemplary embodiment of the present disclosure.

FIG. 8 is a circuit diagram illustrating a configuration of one of a plurality of stages in a shift register according to still another exemplary embodiment of the present disclosure. FIG. 8 is a circuit diagram in which only a wiring connection relationship of the logic unit 820 is partially changed from the circuit diagram illustrated in FIG. 7 and other configuration is substantially same as the circuit diagram illustrated in FIG. 7. Therefore, a redundant description of the stage configuration and the flow of the signal according to an input/output signal will be omitted. For the convenience of description, this will be described with reference to FIGS. 1, 2 and 4.

Referring to FIG. 8, in a stage 800, a logic unit 820 includes a first switching element T1, a second switching element T2, a fourth switching element T4, a fifth switching element T5, a first capacitor C1, and a second capacitor C2. That is, the logic unit 820 includes only four switching elements.

The logic unit 820 includes the first switching element which includes a gate connected to a start voltage line which supplies a start voltage VST and is disposed between a gate high voltage line which supplies a gate high voltage VGH and a Q node Q and a second switching element T2 which includes a gate connected to the Q node Q and is disposed between a QB node QB and the gate low voltage line.

Therefore, the fourth clock CLK4 may not be supplied to the stage 800 during the first period t1. Specifically, only the first switching element T1 includes the gate connected to the start voltage line so that instead of the fourth clock CLK4, the start voltage VST is input to the gate of the first switching element T1 during the first period t1. Therefore, only the first switching element T1 is turned on. Therefore, since the gate high voltage VGH is supplied to the Q node Q, the second switching element T2 is turned on. Moreover, the gate low voltage VGL is supplied to the QB node through the turned-on second switching element T2.

In the shift register according to another exemplary embodiment of the present disclosure, the logic unit 820 of the stage 800 includes only four switching elements. Further, only the first switching element T1 includes the gate to which the start voltage VST is supplied. Therefore, the stage 800 includes a less number of switching elements and a separate clock line which supplies the fourth clock CLK4 is not connected thereto, and only a clock line which includes the first clock CLK1 and the third clock CLK3 is connected thereto. That is, the stage 800 includes only six switching elements and outputs a gate signal by two types of clocks. Further, the clock line which supplies the fourth clock CLK4 may be removed therefrom.

As described above, in the gate driving circuit including the stage 800 according to another exemplary embodiment of the present disclosure, the number of switching elements and clock lines is reduced so that the number of clock signals required to drive one stage 800 in the gate driving circuit may be reduced. Moreover, in the gate driving circuit including the stage 800 according to another exemplary embodiment of the present disclosure, the number of switching elements and clock signals is reduced so that the line space disposed on one side of the display panel. Therefore, the bezel size may be significantly reduced.

The exemplary embodiments of the present disclosure can also be described as follows:

According to an aspect of the present disclosure, the gate driving circuit includes a shift register including a plurality of stages. An n-th stage (n is a positive integer) among the plurality of stages includes a pull-up switching element outputting a first clock to an output node in accordance with a voltage in a Q node, a pull-down switching element outputting a gate low voltage VGL to the output node in accordance with a voltage in a QB node, and a logic unit inverting and outputting a voltage in the Q node and a voltage in the QB node. The logic unit includes a first switching element including a gate to which a fourth clock is input and being between a start voltage line which supplies a start voltage and the Q node, a second switching element including a gate connected to the Q node and being connected to the QB node, a third switching element being between the second switching element and a gate low voltage line which supplies the gate low voltage, a fourth switching element including a gate to which a third clock is input and being between a gate high voltage line which supplies a gate high voltage and the QB node, a fifth switching element including a gate connected to the QB node and being between the Q node and the gate low voltage line, a first capacitor between the Q node and the output node, and a second capacitor between the gate low voltage line and the gate of the pull-down switching element. In the gate driving circuit according to an aspect of the present disclosure, the number of switching elements and the number of clock signals for driving the gate driving circuit are reduced, so that a space required to dispose the gate driving circuit in the display panel is reduced and thus a bezel size of the display panel is also reduced.

The third switching element may include a gate connected to the Q node.

When a voltage in the Q node is high, the second switching element and the third switching element may supply the gate low voltage to the QB node.

The third switching element may include a gate to which the fourth clock is input.

When both the fourth clock and the start voltage are high, the second switching element and the third switching element may supply the gate low voltage to the QB node.

When both a start voltage supplied from the start voltage line and the fourth clock are high, the first switching element may charge the Q node to be high.

When the first clock in a high state is input in a high state of the voltage in the Q node, the first capacitor may raise the voltage in the Q node as the voltage in the output node rises.

A n−1-th stage which is a previous stage of the n-th stage may include a pull-up switching element which outputs the fourth clock to an output node in accordance with a voltage in the Q node.

According to another aspect of the present disclosure, a gate driving circuit includes a shift register including a plurality of stages. An n-th stage (n is a positive integer) among the plurality of stages includes a pull-up switching element including a gate connected to a Q node and being between a first clock line which supplies a first clock and an output node, a pull-down switching element including a gate connected to a QB node and being between a gate low voltage line which supplies a gate low voltage and the output node, and a logic unit inverting and outputting a voltage in the Q node and a voltage in the QB node. The logic unit includes a first switching element including a gate to which a start voltage is input and being between a gate high voltage line which supplies a gate high voltage and the Q node, a second switching element including a gate connected to the Q node and being connected to the QB node, a fourth switching element including a gate to which a third clock is input and being between the gate high voltage line and the QB node, a fifth switching element including a gate connected to the QB node and being between the Q node and the gate low voltage line, a first capacitor between the Q node and the output node, and a second capacitor between the gate low voltage line and the gate of the pull-down switching element. In the gate driving circuit according to another aspect of the present disclosure, the number of switching elements included in the gate driving circuit is significantly reduced so that the number of clock signals required to drive the gate driving circuit is reduced.

The gate driving circuit may further include a third switching element which includes a gate to which the start voltage is input and is disposed between the second switching element and the gate low voltage line.

When the start voltage is high, the first switching element may charge the Q node to be high.

When the first clock is input in a high state in a high state of the voltage in the Q node, the first capacitor may raise the voltage in the Q node as the voltage in the output node rises.

A n+1-th stage which is a previous stage of the n-th stage may include a pull-up switching element which outputs the second clock to an output node in accordance with a voltage in the Q node.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driving circuit, comprising:
a shift register including a plurality of stages, the shift register configured to receive a first clock, a second clock, a third clock, and a fourth clock,
wherein an n-th stage (n is a positive integer) among the plurality of stages includes:
a pull-up switching element that outputs the first clock to an output node based on a voltage at a Q node;
a pull-down switching element that outputs a gate low voltage to the output node based on a voltage at a QB node; and
a logic unit that outputs the voltage at the Q node and the voltage at the QB node, the logic unit including:
a first switching element including a gate to which the fourth clock is input, the first switching element being connected between a start voltage line which supplies a start voltage to the logic unit and the Q node;
a second switching element connected to the QB node, the second switching element including a gate connected to the Q node;
a third switching element connected between the second switching element and a gate low voltage line which supplies the gate low voltage;
a fourth switching element including a gate to which the third clock is input, the fourth switching element being connected between a gate high voltage line which supplies a gate high voltage and the QB node;
a fifth switching element including a gate connected to the QB node, the fifth switching element being connected between the Q node and the gate low voltage line;
a first capacitor connected between the Q node and the output node; and a second capacitor connected between the gate low voltage line and the gate of the pull-down switching element.

2. The gate driving circuit according to claim 1, wherein the third switching element includes a gate connected to the Q node.

3. The gate driving circuit according to claim 2, wherein when the voltage at the Q node is high, the second switching element and the third switching element supply the gate low voltage to the QB node.

4. The gate driving circuit according to claim 1, wherein the third switching element includes a gate to which the fourth clock is input.

5. The gate driving circuit according to claim 4, wherein when both the fourth clock and the start voltage are high, the second switching element and the third switching element supply the gate low voltage to the QB node.

6. The gate driving circuit according to claim 1, wherein when both the start voltage supplied from the start voltage line and the fourth clock are high, the first switching element charges the Q node to be high.

7. The gate driving circuit according to claim 1, wherein when the first clock is input in a high state while the voltage at the Q node is in a high state, the first capacitor raises the voltage at the Q node as the voltage in the output node rises.

8. The gate driving circuit according to claim 1, wherein a n−1-th stage, which is a previous stage with respect to the n-th stage, includes a pull-up switching element that outputs the fourth clock to an output node of the n−1-th stage based on a voltage at a Q node of the n−1-th stage.

9. A gate driving circuit, comprising:
a shift register including a plurality of stages, the shift register configured to receive a first clock, a second clock, a third clock, and a fourth clock,
wherein an n-th stage (n is a positive integer) among the plurality of stages includes:
a pull-up switching element including a gate connected to a Q node, the pull-up switching element being connected between a first clock line which supplies the first clock and an output node;
a pull-down switching element including a gate connected to a QB node, the pull-down switching element being connected between a gate low voltage line which supplies a gate low voltage and the output node; and
a logic unit that outputs a voltage at the Q node and a voltage at the QB node, the logic unit including:
a first switching element including a gate to which a start voltage is input, the first switching element being connected between a gate high voltage line which supplies a gate high voltage and the Q node;
a second switching element connected to the QB node, the second switching element including a gate connected to the Q node;
a third switching element including a gate to which the third clock is input, the third switching element being connected between the gate high voltage line and the QB node;
a fourth switching element including a gate connected to the QB node, the fourth switching element being connected between the Q node and the gate low voltage line;
a first capacitor connected between the Q node and the output node; and
a second capacitor connected between the gate low voltage line and the gate of the pull-down switching element.

10. The gate driving circuit according to claim 9, wherein when the start voltage is high, the first switching element charges the Q node to be high.

11. The gate driving circuit according to claim 9, wherein when the first clock is input in a high state while the voltage at the Q node is in a high state, the first capacitor raises the voltage at the Q node as the voltage in the output node rises.

12. The gate driving circuit according to claim 9, wherein a n+1-th stage, which is a next stage with respect to the n-th stage, includes a pull-up switching element that outputs the second clock to an output node of the n+1-th stage based on a voltage at a Q node of the n+1-th stage.

13. The gate driving circuit according to claim 9, further comprising:
a fifth switching element including a gate to which the start voltage is input, the fifth switching element being connected between the second switching element and the gate low voltage line.

14. The gate driving circuit according to claim 13, wherein when the start voltage is high, the first switching element charges the Q node to be high.

15. The gate driving circuit according to claim 13, wherein when the first clock is input in a high state while the voltage at the Q node is in a high state, the first capacitor raises the voltage at the Q node as the voltage in the output node rises.

16. The gate driving circuit according to claim 13, wherein a n+1-th stage, which is a next stage with respect to the n-th stage, includes a pull-up switching element that outputs the second clock to an output node of the n+1-th stage based on a voltage at a Q node of the n+1-th stage.

* * * * *